United States Patent [19]
Mori et al.

[11] Patent Number: 5,023,693
[45] Date of Patent: Jun. 11, 1991

[54] TRANSISTOR WITH CURRENT SENSING FUNCTION

[75] Inventors: Shogo Mori; Tetsuo Tateishi, both of Kariya, Japan

[73] Assignee: Kabushiki Kaisha Toyoda Jidoshokki Seisakusho, Kariya, Japan

[21] Appl. No.: 532,573

[22] Filed: Jun. 4, 1990

[30] Foreign Application Priority Data

Jun. 6, 1989 [JP] Japan ................................. 1-143263
May 21, 1990 [JP] Japan ................................. 2-130879

[51] Int. Cl.$^5$ ..................... H01L 27/02; H01L 27/22; H01L 29/72; H01L 29/82
[52] U.S. Cl. ....................................... 357/46; 357/27; 357/34; 357/51
[58] Field of Search ................................ 357/46, 27, 34

[56] References Cited

U.S. PATENT DOCUMENTS 4,827,322  5/1989  Takata .................................. 357/46

Primary Examiner—Andrew J. James
Assistant Examiner—Cynthia S. Deal
Attorney, Agent, or Firm—Brooks Haidt Haffner & Delahunty

[57] ABSTRACT

A transistor with current sensing function comprises a main transistor section for conducting a main current and a sense transistor section for sensing the magnitude of the main current. The main transistor section and the sense transistor section have a common collector region, respective individual base regions and respective individual emitter regions. This allows an external drive circuit to supply a base current to a respective base region. As a result, a high-accuracy current sensing function can be implemented without being affected by variations in current and temperature. In addition, by connecting current dividing resistances to the respective base regions of the main transistor section and the sense transistor section to divide a common base current at a constant ratio, the base regions can be regarded as an apparent single base. It thus becomes easy to drive the base.

9 Claims, 7 Drawing Sheets

TRANSISTOR WITH CURRENT SENSING FUNCTION

BACKGROUND OF THE INVENTION

1. Field of the Invention

The present invention relates to a transistor which has a function of sensing the magnitude of a main current and may be applied to various types of transistors such as a bipolar transistor, a static induction transistor and an electric field effect transistor.

2. Description of the Related Art

Heretofore, a multi emitter transistor is known which has a common collector region and a common base region and a number of emitter regions. To provide a current sensing function for such a multi emitter transistor, most of the emitter regions are used as an emitter of a main transistor section for conducting a main current and a few remaining emitter regions are used as an emitter of a sense transistor section for sensing current. In principle, a small current (a sense current) proportional to the main current flowing through the main transistor section flows through the sense transistor section. Thus, by measuring the magnitude of the small current by the use of an external current sensing circuit, it is possible to sense the magnitude of the main current.

With the conventional transistor with the current sensing function described above, the main transistor section and the sense transistor section have common collector and base regions and separate emitter regions. In sensing current, therefore, if current and temperature vary, the base-to-emitter voltage of each of the main transistor section and sense transistor section will vary because of the effect of emitter wiring resistance, varying the ratio between base currents flowing into those transistor sections. This will correspondingly vary the ratio between the main current and the sensing current, making it difficult to accurately sense the magnitude of the main current on the basis of the magnitude of the sense current. Therefore, a high accuracy current sensing function cannot be achieved

Summary of the Invention

It is accordingly an object of the present invention to provide a transistor with current sensing function which permits a current to be sensed with high accuracy without being affected by variations in current and temperature.

A first feature of the present invention resides in the provision of a main transistor section for conducting a main current and a sense transistor section for sensing a current flowing through the main transistor section, the main transistor section and the sense transistor section having a common collector region, respective individual base regions and respective individual emitter regions.

A second feature of the present invention resides in the provision of a main transistor section for conducting a main current; a sense transistor section for sensing a current flowing through the main transistor section, the main transistor section and the sense transistor section having a common collector region, respective individual base regions and respective individual emitter regions; and current dividing resistances for dividing a common base current at a constant ratio to supply divided base currents to the respective base regions of the main transistor section and the sense transistor section. The current dividing resistances may be not only polysilicon resistances or diffused resistances which are formed integral with the transistor but also discrete resistive components external to the transistor.

The present invention may be applied to not only a bipolar transistor but also a static induction transistor or a field effect transistor. Therefore, the terms "emitter", "base" and "collector" are each used herein in a wide meaning so that they may cover "source", "gate" and "drain", respectively.

According to the first feature, the main transistor section and the sense transistor section are provided with respective individual base regions, thereby supplying base currents to the respective base regions from an external drive circuit. By maintaining a ratio of the base currents constant, a ratio of the emitter currents is always kept constant even if the current value or temperature vary. Thus, the current for use in detection is always obtained such that it is proportional to the main current. Therefore, it becomes possible to achieve an accurate current sensing function without being affected by variations in current and temperature.

According to the second embodiment, the common base current supplied from an external drive circuit to the two transistor sections is divided into a main base current and a sense base current by the current dividing resistances, the main base current being allowed to flow into the main transistor section and the sense base current being allowed to flow into the sense transistor section. In this case, since the ratio of magnitude between the current dividing resistances is always constant, the ratio of magnitude of the main base current and the sense base current is also always constant. Thus, it is unnecessary for the external drive circuit to supply a base current to each of the main base and the sense base and it is only required to supply a common base current only to an apparent single base. Thus, the drive circuit may be simpler in construction. Moreover, the base regions and the emitter regions are practically provided independently of each other irrespective of the apparent single base. Thus, its principle of operation is the same as that of the first embodiment, allowing high accuracy current detection independently of variations in current and temperature.

Detailed Description of the Preferred Embodiments

Figure 1:
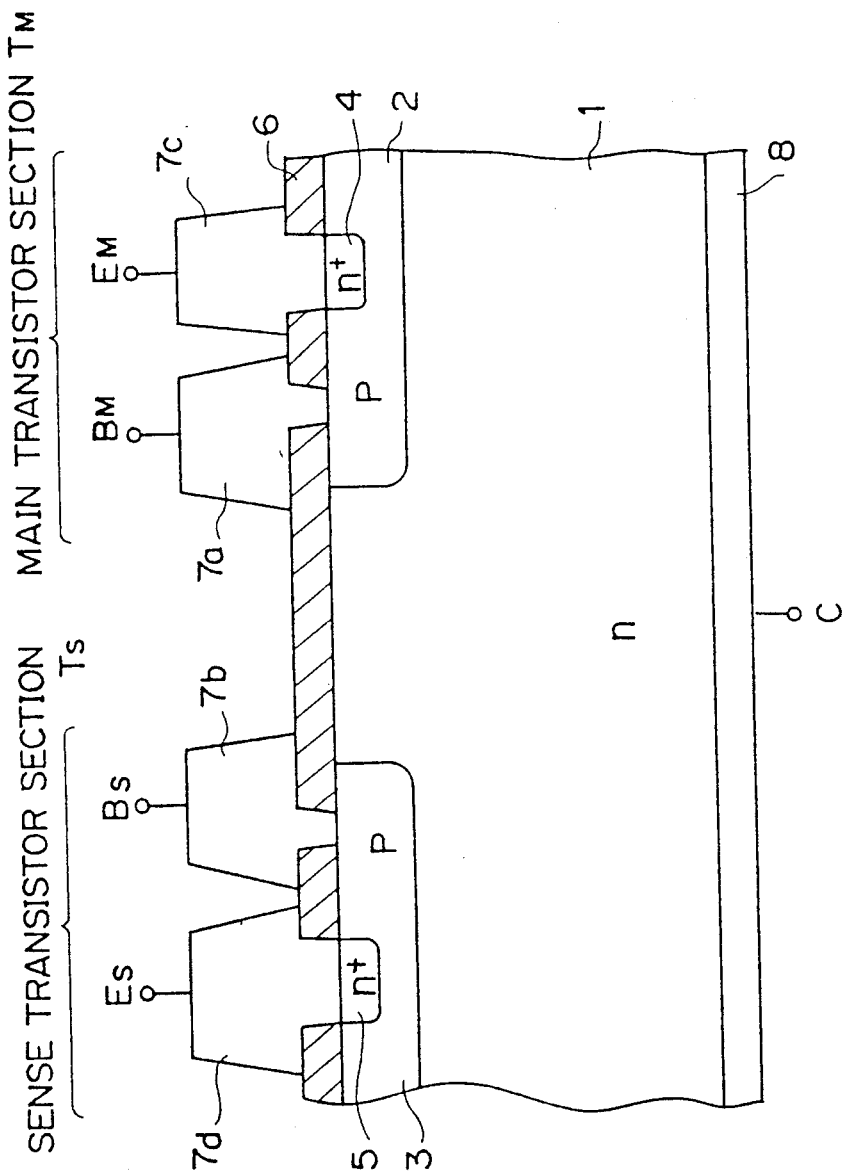
FIG. 1 is a sectional view of a bipolar transistor with current sensing function according to a first embodiment of the present invention.

Referring now to FIG. 1, a bipolar transistor with current sensing function according to a first embodiment of the present invention has two p-type diffused regions 2 and 3, which form base regions, formed spaced apart from each other in a surface portion of an n-type semiconductor substrate 1 which forms a common collector region. In those p-type diffused regions 2 and 3 are respectively formed n+-type diffused regions 4 and 5 which form emitter regions.

The surface of those semiconductor regions is coated with an oxide layer 6, such as a silicon dioxide layer ($SiO_2$), and metal, such as aluminum, is deposited onto p-type diffused regions 2 and 3 and n+-diffused regions 4 and 5 through openings formed in oxide layer 6 to form electrodes 7a, 7b, 7c and 7d. In addition, an electrode 8 is formed over the underside of n-type substrate 1.

By the above structure there are provided an npn-type main transistor section $T_M$ having a collector region, a base region and an emitter region which are formed of n-type substrate 1, p-type diffused region 2 and n+-type diffused region 4, respectively, and an npn-type sense transistor section $T_S$ having a collector region, a base region and an emitter region which are formed of n-type substrate 1, p-type diffused region 3 and n+-diffused region 5, respectively. In other words, main transistor section $T_M$ and sense transistor section $T_S$ have a common collector region, separate base regions and separate emitter regions.

Figure 2:
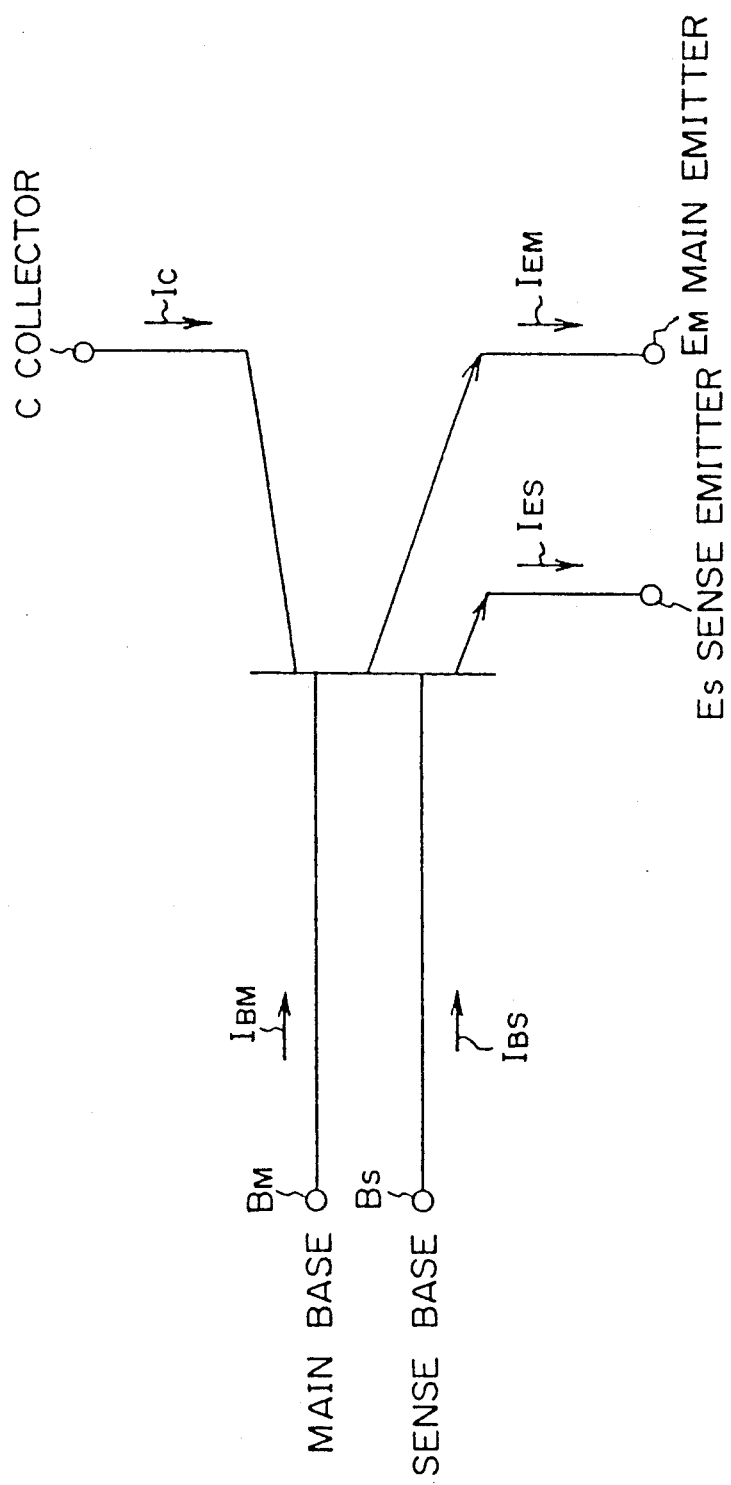
FIG. 2 illustrates a circuit symbol of the transistor structure of FIG. 1.

As illustrated in FIG. 2, collector C is common to two transistor sections $T_M$ and $T_S$ and emitters are provided individually as an emitter (main emitter) $E_M$ for main transistor section $T_M$ and an emitter (sense emitter) $E_S$ for sense transistor section $T_S$. Furthermore, bases are also provided individually as a base (main base) $B_M$ for main transistor section $T_M$ and a base (sense base) $B_S$ for sense transistor section $T_S$.

In the transistor having the above structure, an overall collector current $I_C$ flows into common collector C, an emitter current (main emitter current) $I_{EM}$ which corresponds to a base current (main base current) $I_{BM}$ flowing into main base $B_M$ flows out of main emitter $E_M$ and a small emitter current (sense emitter current) $I_{ES}$ which corresponds to a base current (sense base current) $I_{BS}$ flowing into sense base $B_S$ flows out of sense emitter $E_S$. If, in this case, the ratio between base currents $I_{BM}$ and $I_{BS}$ is constant, then the ratio between emitter currents $I_{EM}$ and $I_{ES}$ and hence the ratio between sense emitter current $I_{ES}$ and collector current $I_C$ will also be constant.

In the present embodiment, since two bases $B_M$ and $B_S$ are provided individually, an external circuit allows separate base currents to flow into the bases. Where it is desired to sense collector current $I_C$ which is a main current, the magnitude of sense emitter current $I_{ES}$ is sensed by an external current sensing circuit with the ratio between main base current $I_{BM}$ and sense base current $I_{BS}$ supplied from the external circuit kept constant. Then, the magnitude of collector current $I_C$ can be found because the magnitude of sense emitter current $I_{ES}$ is proportional to the magnitude of collector current Ic.

According to the present embodiment, an external circuit allows base currents $I_{BM}$ and $I_{BS}$ having a constant ratio to flow into separate bases $B_M$ and $B_S$ and thus, even if current and temperature vary, the ratio between base currents $I_{BM}$ and $I_{BS}$ can be kept constant as described above. Therefore, since the ratio between the main current (collector current $I_C (\approx I_{EM})$) and the sense current (sense emitter current $I_{ES}$) can always be kept constant without being affected by variations in current and temperature, the magnitude of collector current $I_C$ can always be sensed with accuracy on the basis of the measured value of sense emitter current $I_{ES}$.

Next, an example of an overcurrent protection circuit which uses the transistor with current sensing function of the first embodiment and protects the transistor itself from an overcurrent will be described with reference to FIG. 3.

Figure 3:
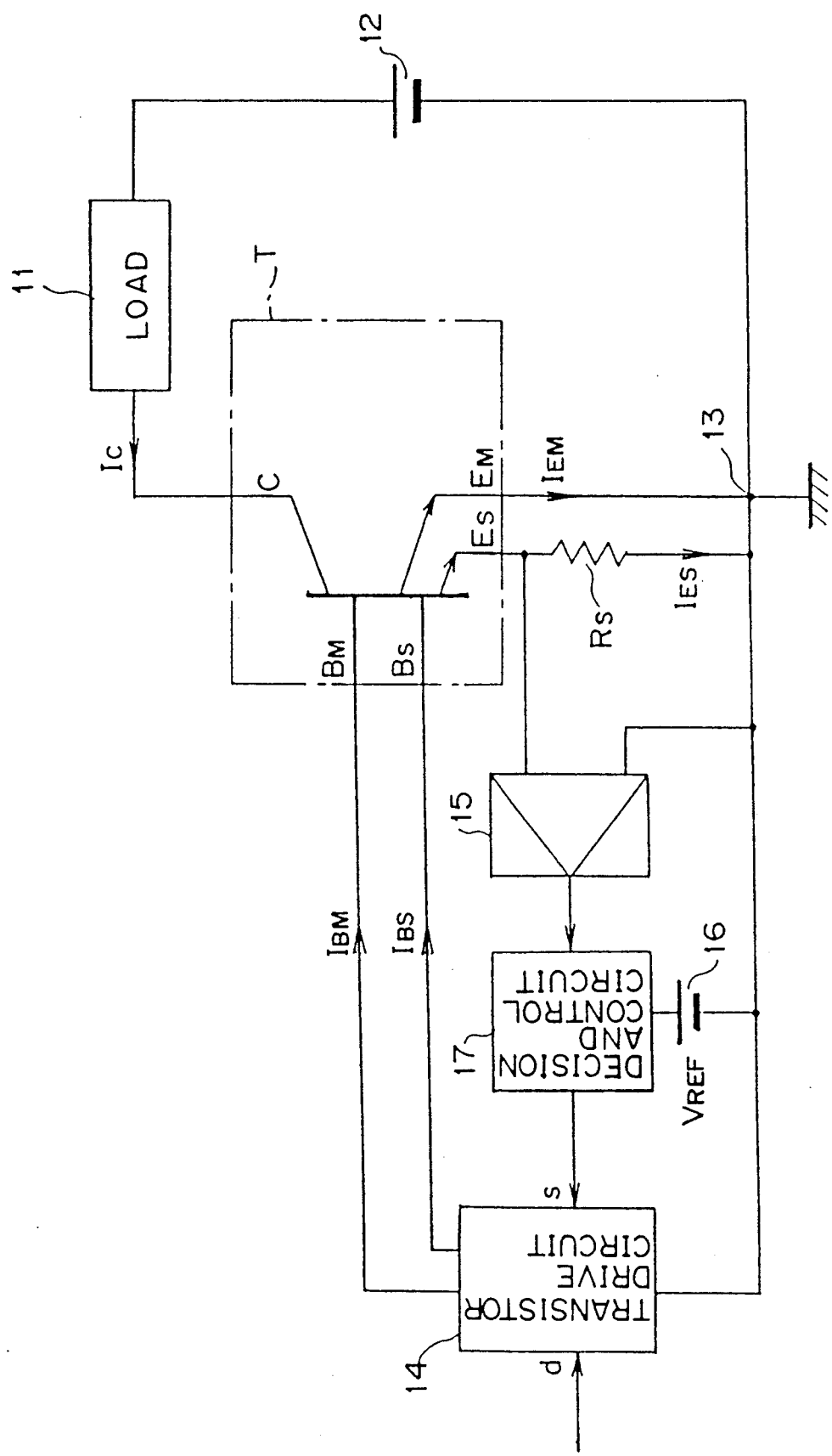
FIG. 3 is a block diagram of an example of an overcurrent protection circuit using the transistor of FIG. 1.

In FIG. 3, transistor T with current sensing function has its collector C connected to the positive terminal of a direct-current power supply 12 via a load 11, its main emitter $E_M$ connected to the negative terminal of power supply 12 via a common terminal 13 and its sense emitter $E_S$ connected to common terminal 13 via a resistor $R_S$ used for sensing current. Furthermore, main base $B_M$ and sense base $B_S$ are connected to a transistor drive circuit 14 to be supplied with base currents $I_{BM}$ and $I_{BS}$ having a constant ratio therefrom.

A voltage developed across current sensing resistor $R_S$ connected to sense emitter $E_S$ is applied to a direct-current amplifier 15, and an output voltage of which, in turn, is applied to a decision and control circuit 17 along with a reference voltage $V_{REF}$ from a reference voltage source 16. An output voltage of decision and control circuit 17, which depends on the result of its decision, is applied to a control input terminal s of transistor drive circuit 14 as a control signal.

The specific operation of the overcurrent protection circuit will be described below.

First, when supplied with a drive signal at a drive input terminal d of transistor drive circuit 14, transistor drive circuit 14 supplies bases $B_M$ and $B_S$ of transistor T with base currents $I_{BM}$ and $I_{BS}$ with a constant ratio therebetween. As a result, transistor T is rendered conductive so that collector current $I_C$ which is the main current flows through load 11. At this point, a small sense emitter current $I_{ES}$ flows through current sensing resistor Rs so that a voltage which is accurately proportional to collector current $I_C$ is developed across resistor Rs. The voltage is amplified by direct-current amplifier 15 at a constant voltage gain.

An output voltage of direct current amplifier 15 is applied to decision and control circuit 17 where it is compared with reference voltage $V_{REF}$. If load 11 is short-circuited by some cause so that collector current $I_C$ becomes excessive and the output voltage of direct current amplifier 15 becomes higher than reference voltage $V_{REF}$, decision and control circuit 17 will decrease the supply of base current $I_{BM}$ and $I_{BS}$ to transistor T. By such a negative feedback loop, load 11 and direct-current power supply 12 are protected from an excessive current.

Although an npn bipolar transistor is illustrated in FIGS. 1 to 3, of course a pnp bipolar transistor may be used instead. In this case as well, the same effect will result.

Figure 4:
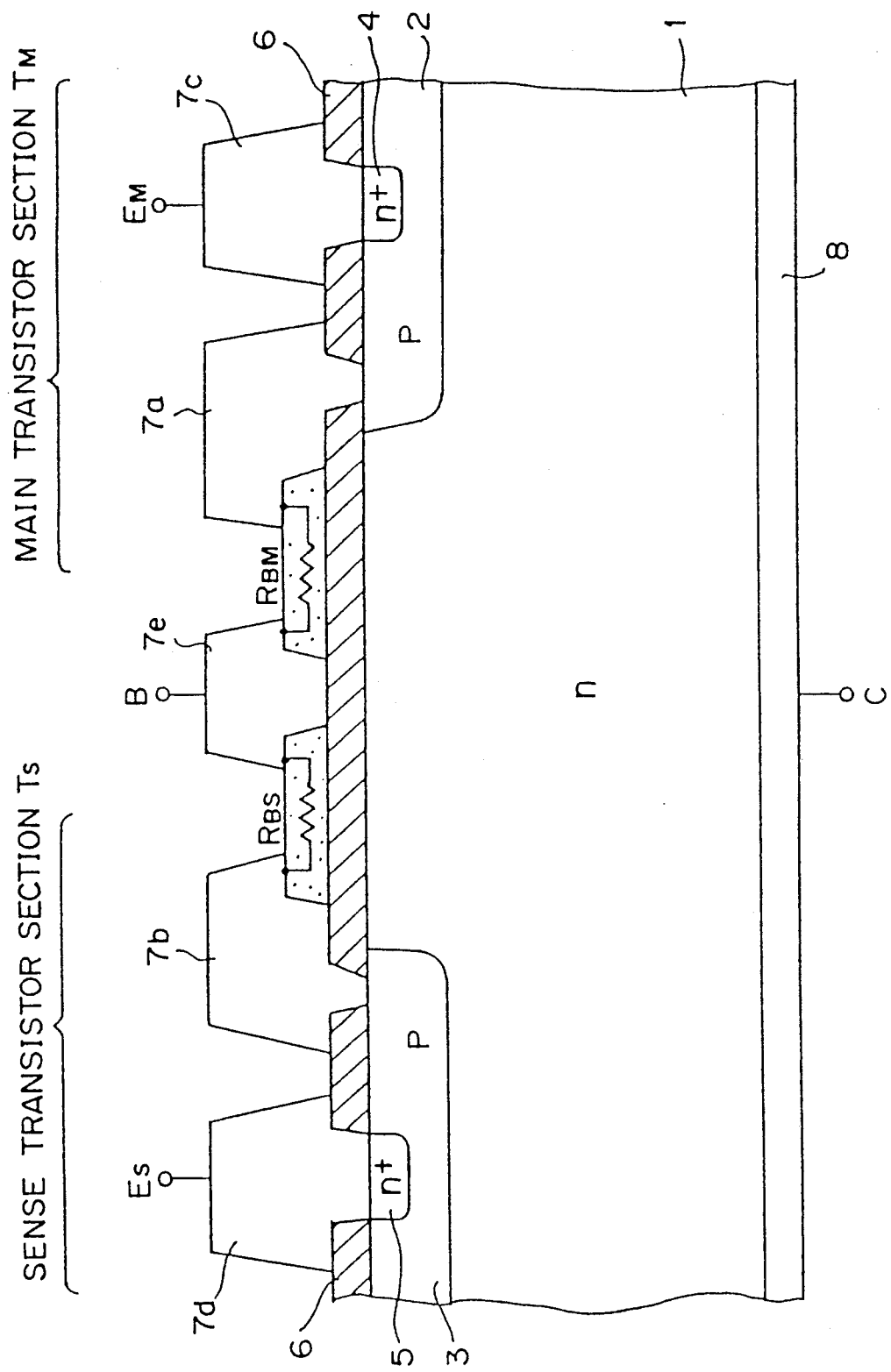
FIG. 4 is a sectional view of a bipolar transistor with current sensing function according to a second embodiment of the present invention.
Figure 5:
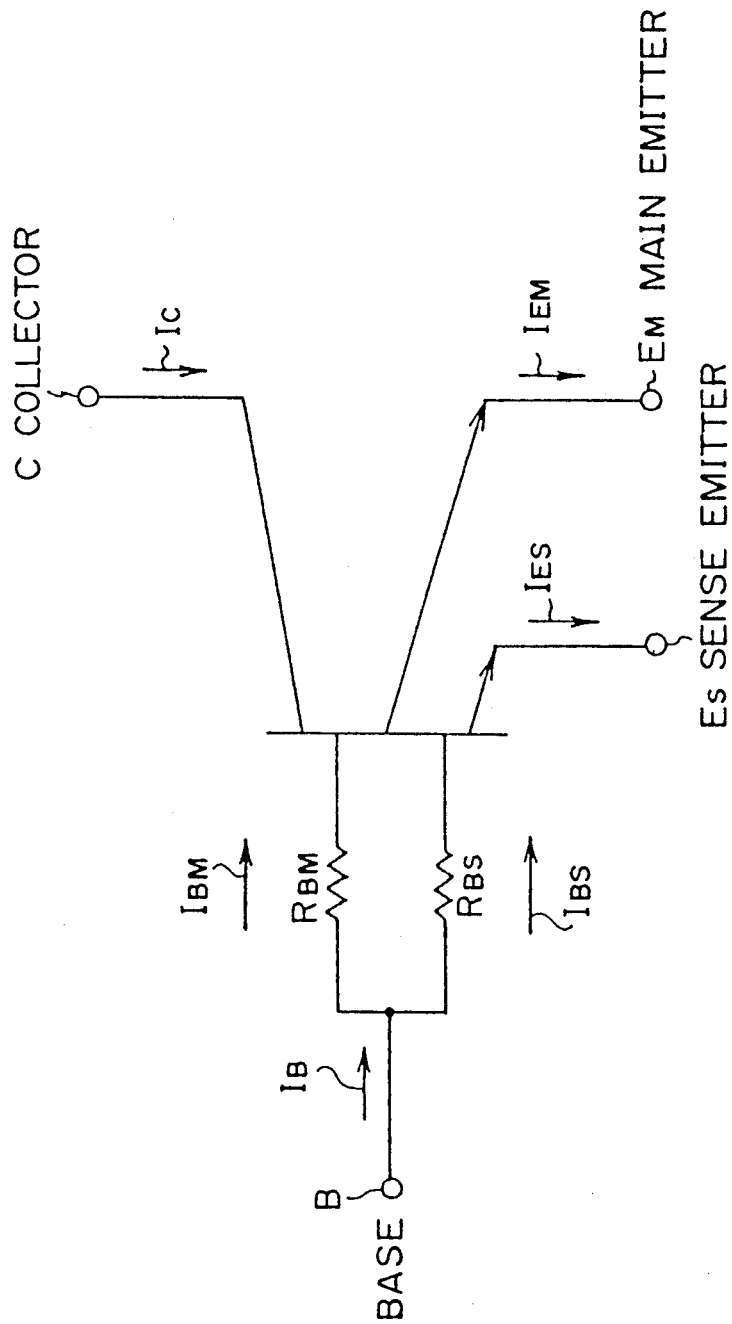
FIG. 5 illustrates a circuit symbol of the transistor structure of FIG. 4.

FIG. 4 is a sectional view of a bipolar transistor with current sensing function according to a second embodiment of the present invention, and FIG. 5 illustrates a circuit symbol of the transistor.

In the second embodiment, as illustrated in FIG. 4, two base-current dividing polysilicon resistances $R_{BM}$ and $R_{BS}$ are formed in predetermined positions on oxide layer 6 of the transistor of the first embodiment shown in FIG. 1. Moreover, an electrode 7a is formed extending from p-type diffused region 2 to resistance $R_{BM}$, an electrode 7b is formed extending from p-type diffused region 3 to resistance $R_{BS}$, and an electrode 7e is formed extending from resistance $R_{BM}$ to resistance $R_{BS}$.

As can be seen from the foregoing, in addition to the structure of the transistor of the first embodiment, the transistor of the second embodiment has a structure such that the base regions (p-type diffused regions 2,3) of main transistor section $T_M$ and sense transistor section $T_S$ are respectively connected to ends of base-current dividing resistances $R_{BM}$ and $R_{BS}$ the other ends of which are connected to common base electrode 7e. To describe the structure in terms of a circuit symbol of FIG. 5, the collector C is common to two transistor sections $T_M$ and $T_S$, the emitters are separately provided as an emitter $E_M$ (main emitter) for main transistor section $T_M$ and an emitter $E_S$ (sense emitter) for sense transistor section $T_S$, and the bases have one end of two resistances $R_{BM}$ and $R_{BS}$ extended from the separated base regions in common to form an apparent single base B.

The base current dividing resistances $R_{BM}$ and $R_{BS}$ are set such that $R_{BM} \leq R_{BS}$ and transistor sections $T_M$ and $T_S$ have their respective intrinsic base-to-emitter resistances $R_{BE}$ and $R_{BE}$ set such that $R_{BE} \leq R_{BM}$ and $R_{BE} \leq R_{BS}$. Note that the magnitudes of and the ratio between $R_{BM}$ and $R_{BS}$ may be set properly by determining their layout dimensions (width, length, thickness and shape). Alternatively, a large number of basic resistances of the same size may be formed in advance and those resistances may be connected in series or in parallel to form $R_{BM}$ and $R_{BS}$ of a desired magnitude and ratio.

In the transistor having the above structure, a base current $I_B$ allowed to flow into base B by an external drive circuit is divided into currents $I_{BM}$ and $I_{BS}$ ($I_{BM} \geq I_{BS}$) by resistances $R_{BM}$ and $R_{BS}$, current $I_{BM}$ flowing into the base region of main transistor section $T_M$ as a main base current and current $I_{BS}$ flowing into the base region of sense transistor section $T_S$ as a sense base current. On the other hand, an entire collector current $I_C$ flows into common collector C, an emitter current (main emitter current) $I_{EM}$ corresponding to main base current $I_{BM}$ flows into main emitter $E_M$ and a small emitter current (sense emitter current) $I_{ES}$ corresponding to sense base current $I_{BS}$ flows into sense emitter $E_S$.

The polysilicon forming two resistances $R_{BM}$ and $R_{BS}$ has a temperature coefficient. However, since resistances $R_{BM}$ and $R_{BS}$ are formed of the same polysilicon, the ratio between $R_{BM}$ and $R_{BS}$ is always constant independently of temperature variations. Thus, as the ratio between the magnitudes of resistors $R_{BM}$ and $R_{BS}$, the ratio between main base current $I_{BM}$ and sense base current $I_{BS}$ is always constant. If, therefore, common base current $I_B$ supplied to apparent single base B from the external drive circuit is constant, the magnitude of each of base currents $I_{BM}$ and $I_{BS}$ will always be constant.

Figure 6:
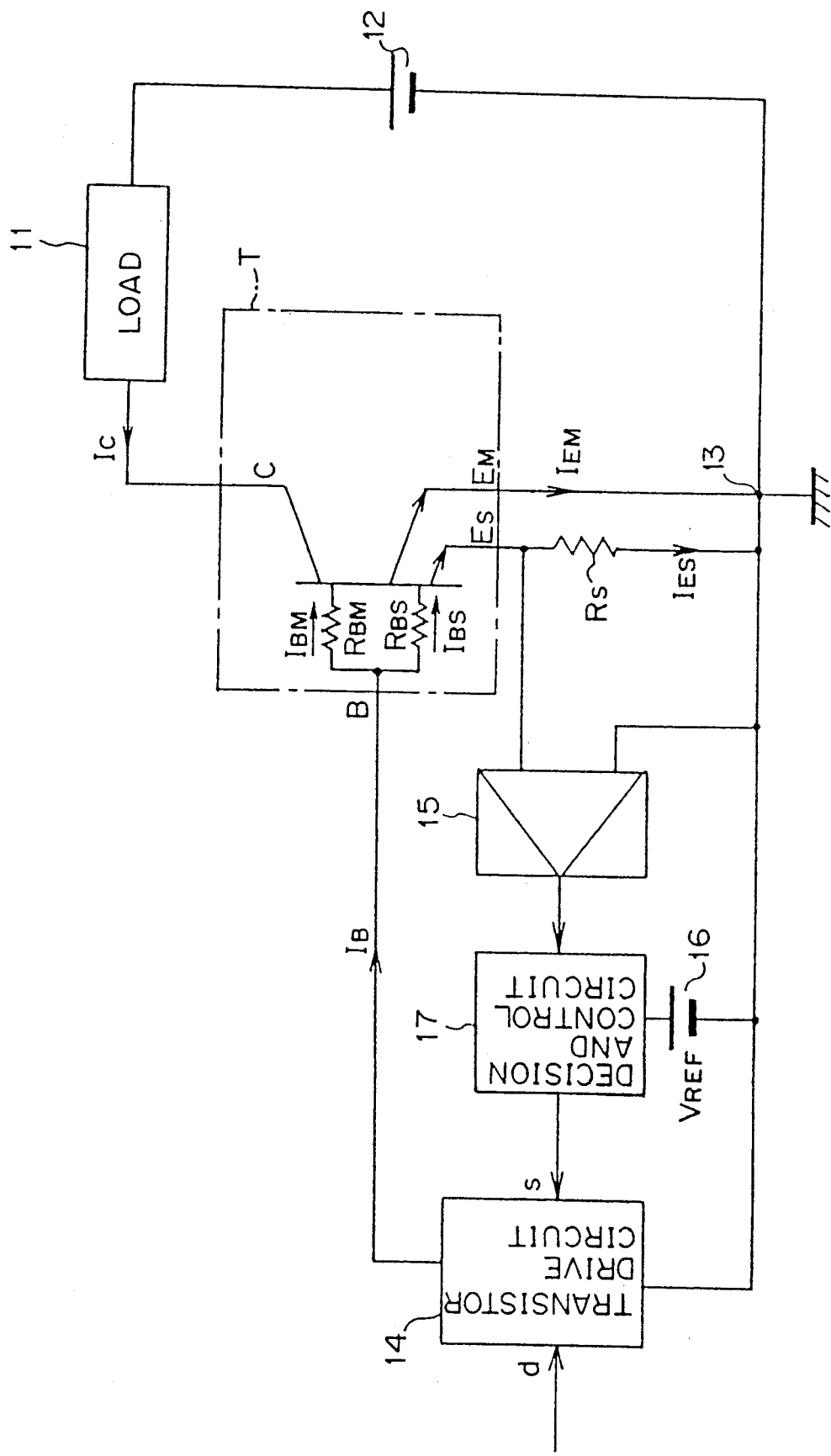
FIG. 6 is a block diagram of an example of an overcurrent protection circuit using the transistor of FIG. 4.

Thus, it is unnecessary for the external drive circuit to supply main base $B_M$ and sense base $B_S$ with their respective base currents $I_{BM}$ and $I_{BS}$ with a constant ratio therebetween as in the first embodiment. The external drive circuit is only required to supply common base current $I_B$ to apparent single base B alone in order that base currents $I_{BM}$ and $I_{BS}$ with a constant ratio may always flow into the main transistor section and the sense transistor section. Thus, the external drive circuit may be simple in circuit arrangement. For example, where an overcurrent protection circuit is constituted by the use of the transistor according to the present embodiment as illustrated in FIG. 6, transistor drive circuit 14 has only to control only the common base current $I_B$ to be applied to apparent single base B of transistor T.

Moreover, the principle of operation of the transistor of the second embodiment is the same as that of the transistor of the first embodiment because the base regions (p-type diffused regions 2, 3) and the emitter regions (n+-type diffused regions 4, 5) are independent of each other irrespective of the apparent single base B. Thus, high-accuracy current detection is possible independently of variations in current and temperature. That is, so long as the ratio between current dividing resistances $R_{BM}$ and $R_{BS}$ is held constant, the ration between collector current $I_C (\approx I_{EM})$ which is the main current and sense emitter current $I_{ES}$ which is the sense current can always be held constant. Thus, the magnitude of collector current $I_C$ can always be sensed with accuracy on the basis of the measured value of sense emitter current $I_{ES}$.

Figure 7:
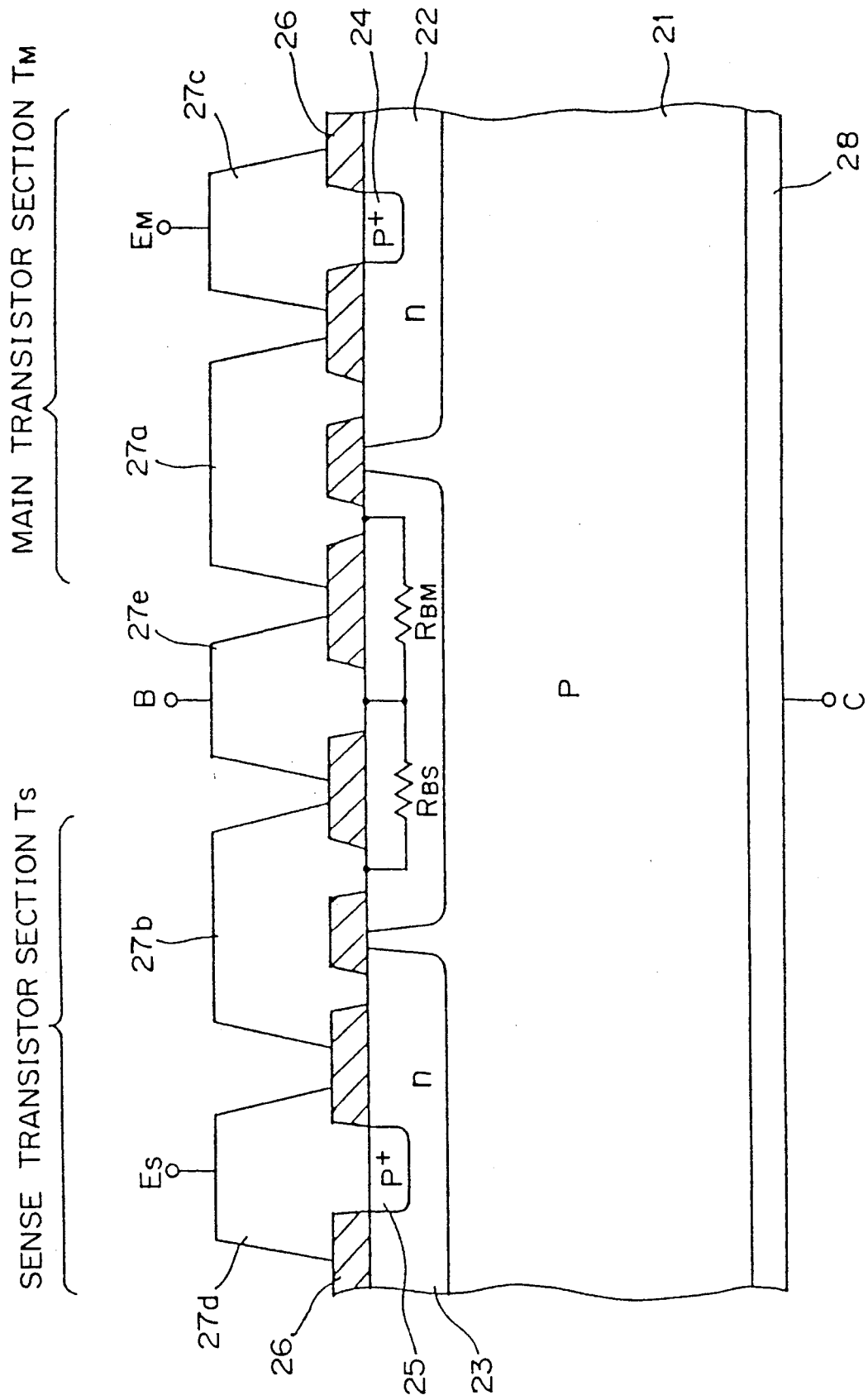
FIG. 7 is a sectional view of a bipolar transistor with current sensing function according to a third embodiment of the present invention.

FIG. 7 is a sectional view of a bipolar transistor with current sensing function according to a third embodiment of the present invention.

In this embodiment, the conductivity type of each semiconductor region is opposite to that of its corresponding region in the first and second embodiments to form a pnp transistor and current dividing resistances $R_{BM}$ and $R_{BS}$ are formed of diffused resistances.

As is evident from FIG. 7, two n-type diffused regions 22 and 23, which form base regions, are formed spaced apart in a surface portion of a p-type semiconductor substrate 21 which forms a common collector region and p+-type diffused regions 24 and 25 are formed within n-type diffused regions 22 and 23, respectively, to form emitter regions. In addition, two diffused regions are formed in a predetermined position of the surface portion of p-type substrate 21 to form base current dividing resistances $R_{BM}$ and $R_{BS}$. The magnitude of and the ratio between resistances $R_{BM}$ and $R_{BS}$ may be set as is the case with the polysilicon resistances in the second embodiment. The entire surface of the semiconductor substrate is coated with an oxide layer 26. Through openings formed in oxide layer 26 an electrode 27a is formed on n-type diffused region 22 and resistance $R_{BM}$, an electrode 27b is formed on n-type diffused region 23 and resistance RBS, an electrode 27c is formed on p+-type diffused region 24 an electrode 27d is formed on p+-type diffused region 25, and an electrode 27e is formed on the junction of resistances $R_{BM}$ and $R_{BS}$. In addition, an electrode 28 is formed over the entire surface of the underside of substrate 21.

By the above structure are provided a pnp main transistor section $T_M$ comprising a collector region, a base region and an emitter region which are formed of p-type substrate 21, n-type diffused region 22 and p+-type diffused region 24, respectively, and a pnp sense transistor section $T_S$ comprising a collector region, a base region and an emitter region which are formed of p-type substrate 21, n-type diffused region 23 and p+-type diffused region 25, respectively. As with the first and second embodiments, two transistor sections $T_M$ and $T_S$ have a common collector region, separate base regions and separate emitter regions. Transistor sections $T_M$ and $T_S$ have their respective base regions (n-type diffused regions 22, 23) connected to one ends of resistances $R_{BM}$ and $R_{BS}$ the other ends of which are connected together to common base electrode 27e.

The circuit symbol of the transistor of the third embodiment described above is the same as that of FIG. 5 except that the direction of each current flow is reversed. Therefore, the present embodiment also allows current to be sensed with accuracy independently of variations in current and temperature as in the second embodiment and moreover the drive circuit for supplying a base current may be simple in construction.

In forming the resistances by diffusing impurities into semiconductor regions, conductivity types should be taken into consideration in order for resultant parasitic elements not to adversely affect the inherent transistor characteristics.

In the second and third embodiments, base current dividing resistances $R_{BM}$ and $R_{BS}$ are formed within the device. Of course, these resistances may be formed outside of the device. However, it is preferred that the two resistances be formed within the device. In this case, the resistances can be formed by the same manufacturing step using the same material so that it becomes easy to allow them to have the same temperature coefficient. Therefore, the ratio in magnitude between base currents $I_{BM}$ and $I_{BS}$ resulting from current division by the resistances can be held constant more accurately. Note that means for forming the resistances within the device is not limited to those described in connection with the above embodiments. Any means may be used so long as it can hold the ratio between two resistances constant and it does not adversely affect transistor characteristics.

The present invention may be applied to various types of transistors, such as a static induction transistor and a field effect transistor, in addition to a bipolar transistor.

According to the first embodiment, the main transistor section and the sense transistor section are provided with respective individual base regions. Thus, by supplying a base current to each of the base regions from an external drive circuit, it becomes possible to achieve an accurate current sensing function without being affected by variations in current and temperature.

According to the second embodiment, it is unnecessary to supply a base current to each of two bases (main base and sense base) as in the first embodiment and it is only required to supply a common base current only to an apparent single base. Thus, a drive circuit for supplying the base current may be simple in construction. Moreover, although the base regions form an apparent single base, the common base current is divided practically into a main base current and a sense base current at a constant ratio by the base current dividing resistances to flow into the respective base regions. Thus, its principle of operation is the same as that of the first embodiment, allowing high accuracy current detection independently of variations in current and temperature.

What is claimed is:

1. A monolithic transistor having a main transistor section for conducting a main current and a sensing transistor section for sensing the current flowing through said main section, said transistor comprising:
    a collector substrate common to said main transistor section and said sensing transistor section;
    said main transistor section comprising a base diffusion region in said substrate, an emitter diffusion region in said base region, a first electrode electrically connected to said emitter diffused region and electrically separated from said base diffusion region and a second electrode electrically connected to said base diffusion region and electrically separated from said emitter diffusion region; and
    said sensing transistor section comprising a further base diffusion region in said substrate electrically separated from said base diffusion region of said main transistor section, a further emitter diffusion region in said base region, a third electrode electrically connected to said further emitter diffused region and electrically separated from said base diffusion region of said main transistor section and a fourth electrode electrically connected to said further base diffusion region and electrically separated from said further emitter diffusion region.

2. A transistor as set forth in claim 1 further comprising at least one resistor interconnecting said first and third electrodes.

3. In combination with the transistor of claim 1, current supplying means connected to said second electrode and to said fourth electrode for supplying currents thereto of a constant predetermined ratio.

4. The combination set forth in claim 3 further comprising current control means connected in circuit with said third electrode and to said current supplying means for controlling the currents supplied by the current supplying means, said current control means being responsive to the sensing current of said third electrode.

5. A transistor as set forth in claim 1 further comprising a first resistor electrically at one end said fourth electrode and a second resistor electrically connected at one end to said second electrode, the opposite ends of said first resistor and said second resistor being electrically interconnected, said second resistor having a resistance value larger than the resistance value of said first resistor for providing base currents to said second and fourth electrodes in a predetermined ratio.

6. A transistor as set forth in claim 5 wherein said first resistor and said second resistor are secured to said transistor.

7. A transistor as set forth in claim 6 wherein said first resistor and said second resistor are polysilicon resistors formed on a surface of the transistor.

8. A transistor as set forth in claim 6 wherein said first resistor and said second resistor are resistive diffused regions in said substrate.

9. A transistor as set forth in claim 6 further comprising a fifth electrode electrically connected to said opposite ends of said first resistor and said second resistor.

* * * * *

UNITED STATES PATENT AND TRADEMARK OFFICE
CERTIFICATE OF CORRECTION

PATENT NO. : 5,023,693

DATED : June 11, 1991

INVENTOR(S) : S. Mori et al

It is certified that error appears in the above-identified patent and that said Letters Patent is hereby corrected as shown below:

Col. 1, lines 2 and 3, delete "148c BACKGROUND OF THE INVENTION".

After the title insert --BACKGROUND OF THE INVENTION--

Column 1, line 41, after "achieved", insert period --.--;
line 42, start new section "Summary of the Invention".

Column 5, line 15, after "of" insert --each of--;

line 19, after "$R_{BM}$", change symbol to read --<<--;

line 21, after "and" (first occurrence) change "$R_{BE}$" (second occurrence) to --$R_{BE'}$--; after "$R_{BE}$" (third occurrence), change symbol to read --<<--;

line 22, change "$R_{BE}$" to --$R_{BE'}$--; after "$R_{BE}$" change symbol to read --<<--;

line 33, change symbol "$\geq$" to -->>--; change "$R_{BS}$" to --$R_{BS'}$-- and delete the comma ",".

Column 6, line 45, after "24" insert comma --,--.

UNITED STATES PATENT AND TRADEMARK OFFICE
CERTIFICATE OF CORRECTION

PATENT NO. : 5,023,693

DATED : June 11, 1991

INVENTOR(S) : S. Mori et al

It is certified that error appears in the above-identified patent and that said Letters Patent is hereby corrected as shown below:

Column 8, line 38, after "end" insert --to--.

Signed and Sealed this

Second Day of February, 1993

Attest:

STEPHEN G. KUNIN

Attesting Officer     Acting Commissioner of Patents and Trademarks